(12) United States Patent
Wang et al.

(10) Patent No.: US 7,935,602 B2
(45) Date of Patent: May 3, 2011

(54) SEMICONDUCTOR PROCESSING METHODS

(75) Inventors: Hongmei Wang, Boise, ID (US); Fred D. Fishburn, Boise, ID (US); Janos Fucsko, Boise, ID (US); T. Earl Allen, Kuna, ID (US); Richard H. Lane, Boise, ID (US); Robert J. Hanson, Boise, ID (US); Kevin R. Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/168,861

(22) Filed: Jun. 28, 2005

(65) Prior Publication Data

US 2006/0292787 A1    Dec. 28, 2006

(51) Int. Cl.
*H01L 21/336* (2006.01)
*H01L 21/311* (2006.01)
*H01L 21/302* (2006.01)

(52) U.S. Cl. ........ 438/296; 438/695; 438/701; 438/702; 438/706; 438/719; 257/E21.549; 257/E21.555

(58) Field of Classification Search .................. 438/296, 438/702, 701, 695, 706, 719; 257/E21.549, 257/E21.555
See application file for complete search history.

(56) References Cited

U.S. PATENT DOCUMENTS

| 4,845,048 | A | * | 7/1989 | Tamaki et al. | 438/410 |
| 5,112,771 | A | * | 5/1992 | Ishii et al. | 438/389 |
| 5,681,773 | A | * | 10/1997 | Tseng | 438/396 |
| 5,801,083 | A | | 9/1998 | Yu et al. | |
| 5,963,789 | A | | 10/1999 | Tsuchiaki | |
| 5,972,758 | A | | 10/1999 | Liang | |
| 6,232,202 | B1 | * | 5/2001 | Hong | 438/424 |
| 6,285,057 | B1 | | 9/2001 | Hopper et al. | |
| 6,313,008 | B1 | * | 11/2001 | Leung et al. | 438/424 |
| 6,448,100 | B1 | * | 9/2002 | Schulte et al. | 438/20 |

(Continued)

FOREIGN PATENT DOCUMENTS

DE    101 57 785 A 1    6/2003

(Continued)

OTHER PUBLICATIONS

"S-RCAT (Sphere-shaped-Recess-Channel-Array-Transistor) Technology for 70nm DRAM feature size and beyond"; J.Y. Kim et al; 2005 Symposium on VLSI Technology Digest of Technical Papers; pp. 34-35.

(Continued)

*Primary Examiner* — Charles D Garber
*Assistant Examiner* — Ron Everett Pompey
(74) *Attorney, Agent, or Firm* — Wells St. John, P.S.

(57) ABSTRACT

The invention includes methods of forming isolation regions. An opening can be formed to extend into a semiconductor material, and an upper periphery of the opening can be protected with a liner while a lower periphery is unlined. The unlined portion can then be etched to form a widened region of the opening. Subsequently, the opening can be filled with insulative material to form an isolation region. Transistor devices can then be formed on opposing sides of the isolation region, and electrically isolated from one another with the isolation region. The invention also includes semiconductor constructions containing an electrically insulative isolation structure extending into a semiconductor material, with the structure having a bulbous bottom region and a stem region extending upwardly from the bottom region to a surface of the semiconductor material.

14 Claims, 7 Drawing Sheets

U.S. PATENT DOCUMENTS

| | | | | |
|---|---|---|---|---|
| 6,482,701 B1 * | 11/2002 | Ishikawa et al. | | 438/270 |
| 6,521,538 B2 * | 2/2003 | Soga et al. | | 438/695 |
| 6,716,757 B2 * | 4/2004 | Lin et al. | | 438/705 |
| 7,160,789 B2 * | 1/2007 | Park | | 438/426 |
| 2002/0031898 A1 * | 3/2002 | Gonzalez et al. | | 438/439 |
| 2003/0190766 A1 | 10/2003 | Gonzalez et al. | | |
| 2004/0110358 A1 | 6/2004 | Lee | | |

FOREIGN PATENT DOCUMENTS

EP      1 229 579 A1      8/2002

OTHER PUBLICATIONS

US2006/020877, May 2006, PCT Search Report.

\* cited by examiner

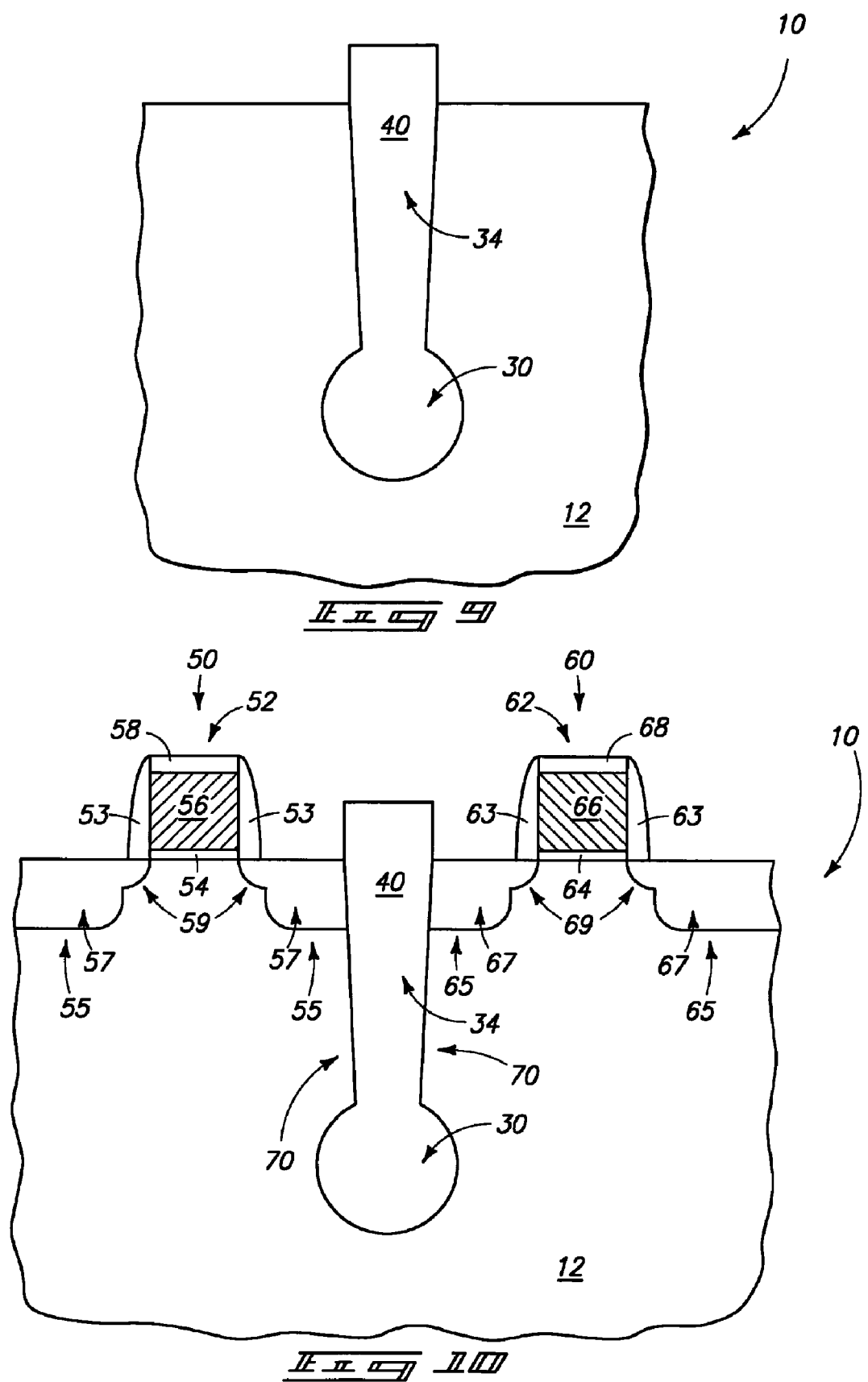

SEMICONDUCTOR PROCESSING METHODS

TECHNICAL FIELD

The invention pertains to semiconductor processing methods, and to semiconductor constructions.

BACKGROUND OF THE INVENTION

As the level of integration of integrated circuitry increases, it is becoming an ever greater challenge to maintain electrical isolation between adjacent electrical devices. For instance, the density of dynamic random access memory (DRAM) has been approximately quadrupled every three years by virtue of advances in DRAM technology. As the device dimensions scale down, it is becoming more and more challenging to maintain electrical isolation (especially cell-to-cell isolation) in the memory array region due to reduction of space for isolation structures. A common isolation structure is a trenched isolation structure (such as, for example, a shallow trench isolation structure), and it is becoming increasingly challenging to form and fill the trenches of such isolation structures within the ever-decreasing real estate available for the structures.

Cell-to-cell isolation is becoming a greater factor in causing failure of integrated circuitry, with such failure frequently being due to leakage around a trenched isolation region. Field implants have been utilized in an attempt to prevent leakage around trenched isolation structures, but such can create problems with refresh.

Cell-to-cell isolation is already problematically challenging, and is expected to become even more challenging for future generations of devices due to the tighter pitch and smaller space available for isolation structures of the future. Accordingly, it is desirable to develop new isolation structures. It would be particularly desirable for such isolation structures to be suitable for cell-to-cell isolation.

SUMMARY OF THE INVENTION

In one aspect, the invention includes a semiconductor processing method. A semiconductor material is provided, and an opening is formed to extend into the semiconductor material. An upper periphery of the opening is provided with a liner while at least a portion of a lower periphery of the opening is unlined. Etching is conducted through the unlined portion to form a bulbous extension of the opening, and such bulbous extension is substantially filled with insulative material.

In one aspect, the invention encompasses a semiconductor processing method. A semiconductor material is provided and an opening is formed to extend into the semiconductor material to a first depth. A periphery of the opening is lined with a protective liner, except for the lower region of the opening. Etching is conducted through the unlined lower region of the opening with an etch that is at least substantially isotropic to form a widened extension of the opening.

In one aspect, the invention encompasses a semiconductor processing method. A silicon-containing material is provided. An opening is formed to extend into the silicon-containing material. The opening has a bulbous bottom region and a stem region extending upwardly from the bottom region to a surface of the silicon-containing material. The opening is substantially filled with insulative material. A first transistor device is formed on one side of the opening, with the first transistor device having a pair of first source/drain regions extending into the silicon-containing material. A second transistor device is formed on an opposing side of the opening from the first transistor device, with the second transistor device having a pair of second source/drain regions extending into the silicon-containing material. The insulative material within the opening is utilized to provide electrical isolation between the first and second transistor devices.

In one aspect, the invention includes a semiconductor construction. The construction comprises a semiconductor material and an electrically insulative structure extending into the semiconductor material. The electrically insulative structure has a bulbous bottom region and a stem extending upwardly from the bottom region to a surface of the semiconductor material. The construction can further include a first transistor device on one side of the electrically insulative structure and a second transistor device on an opposing side of the electrically insulative structure, with the insulative material of the insulative structure providing electrical isolation between the first and second transistor devices.

BRIEF DESCRIPTION OF THE DRAWINGS

Preferred embodiments of the invention are described below with reference to the following accompanying drawings.

FIG. 9 is a view of the FIG. 1 wafer fragment shown at a processing stage subsequent to that of FIG. 8.

FIG. 10 is a view of the FIG. 1 wafer fragment shown at a processing stage subsequent to that of FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes processes in which bottom regions of openings or trenches are expanded. In particular aspects, the openings having expanded bottom regions are filled with insulative material to create trenched isolation structures. Such isolation structures can provide improvements relative to prior art isolation structures for cell-to-cell isolation in a memory array. Some specific applications of the invention utilize isolation structures formed in accordance with the invention to improve refresh and functionality of devices associated with a memory array relative to the refresh and functionality that would occur in prior art constructions. In some aspects of the invention, the expanded bowl (i.e., expanded bottom region) of an isolation region formed in accordance with the invention is kept relatively far away from channel regions of access devices so that operating parameters of the devices (for example, channel length and drive current) are not adversely impacted by the utilization of the isolation region of the present invention.

A particular aspect of the invention is described with reference to FIGS. 1-10.

Figure 1:
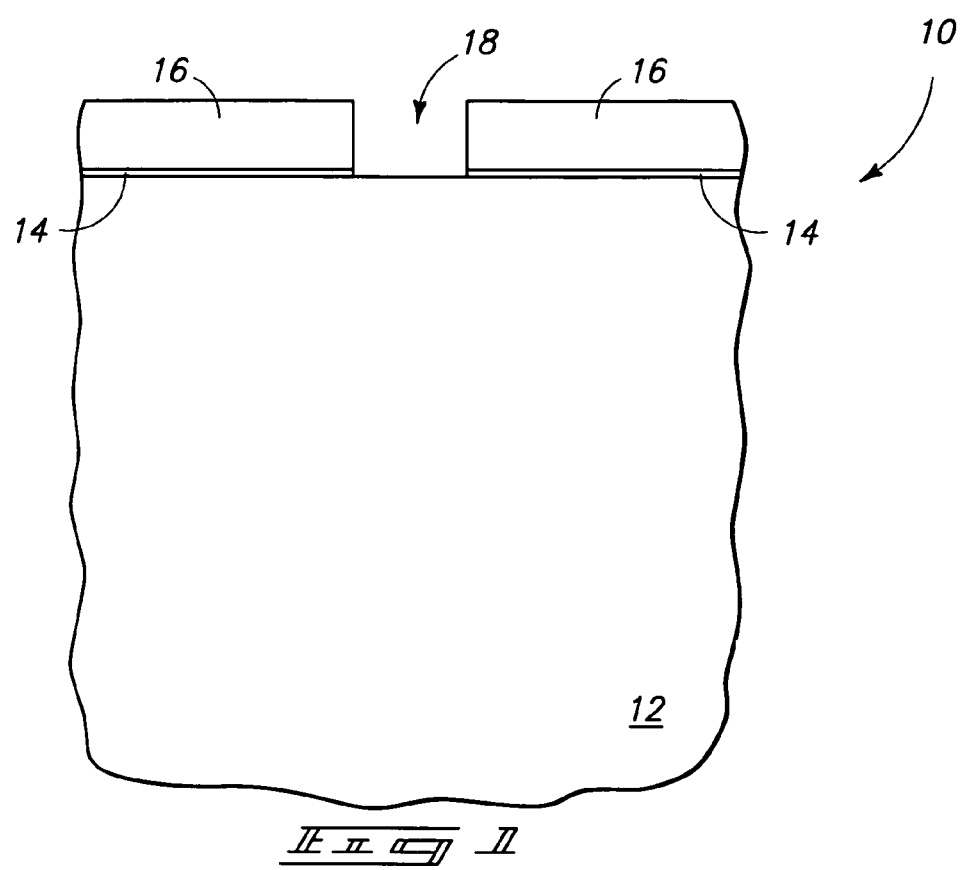
FIG. 1 is a diagrammatic, cross-sectional view of a semiconductor wafer fragment at a preliminary processing stage of an exemplary aspect of the present invention.

Referring to FIG. 1, a semiconductor construction 10 is illustrated at a preliminary processing stage. Construction 10 comprises a substrate 12. The substrate can comprise, consist essentially of, or consist of monocrystalline silicon lightly doped with suitable background dopant, and in particular aspects can comprise, consist essentially of, or consist of monocrystalline silicon lightly background doped with p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Although silicon is one exemplary semiconductor material that can be incorporated into substrate 12, it is to be understood that the substrate can comprise other semiconductor materials, including, for example, germanium.

A layer 14 comprising, consisting essentially of, or consisting of silicon dioxide is formed over substrate 12; and a layer 16 comprising, consisting essentially of, or consisting of silicon nitride is formed over layer 14. The layers 14 and 16 are together patterned to form a hard mask over substrate 12. The patterned hard mask has an opening 18 extending therethrough to an upper surface of substrate 12. Layers 14 and 16 can be patterned through any suitable processing, including, for example, forming photolithographically patterned photoresist over layer 16, transferring a pattern from the photoresist to the underlying layers 14 and 16, and subsequently removing the photoresist.

Figure 2:
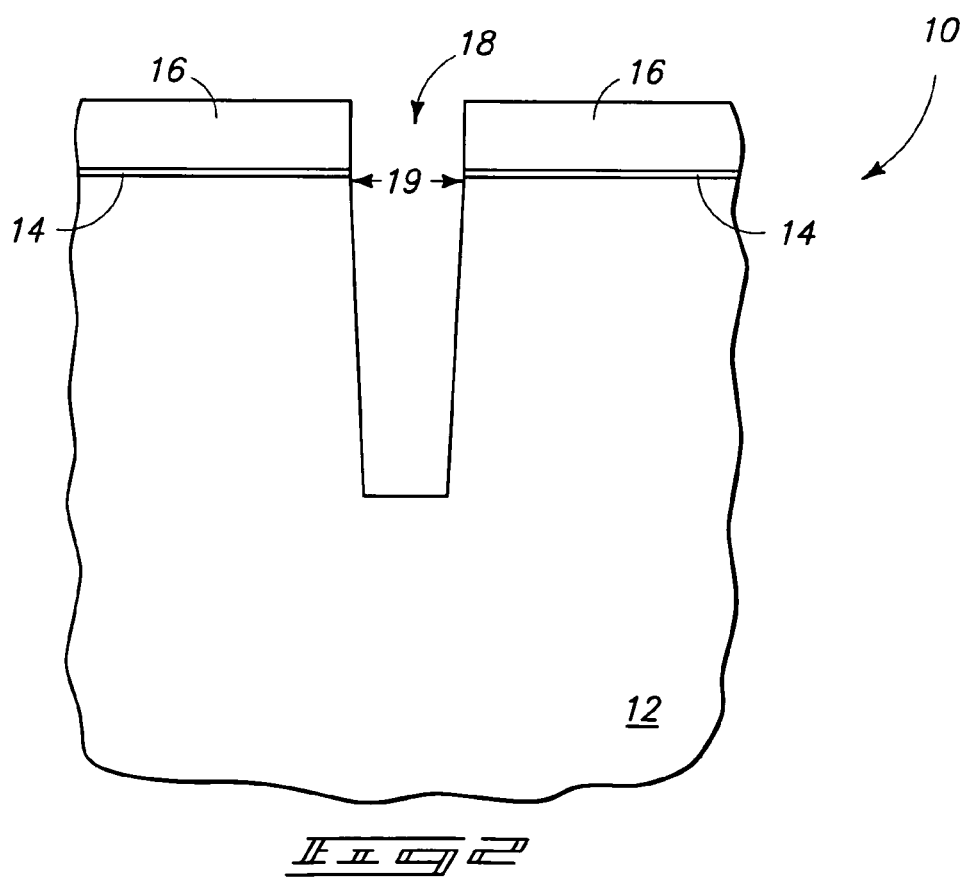
FIG. 2 is a view of the FIG. 1 wafer fragment shown at a processing stage subsequent to that of FIG. 1.

Referring to FIG. 2, opening 18 is extended into semiconductor material of substrate 12. The opening is extended with a suitable anisotropic etch, and can be extended to any suitable depth within the substrate. For instance, if opening 18 is ultimately to be used in forming a trenched isolation region, the opening can be extended to a depth approximately equal to that conventionally utilized for trenched isolation regions. The opening can have any suitable shape, and in particular aspects can be a trench extending longitudinally into and out of the page relative to the cross-sectional view of FIG. 2.

The opening 18 has a maximum cross-sectional width 19 extending transversely across the opening at a widest portion of the opening within substrate 12. Such width can be any suitable width, and in particular aspects will be a width of less than or equal to about 100 nanometers.

Figure 3:
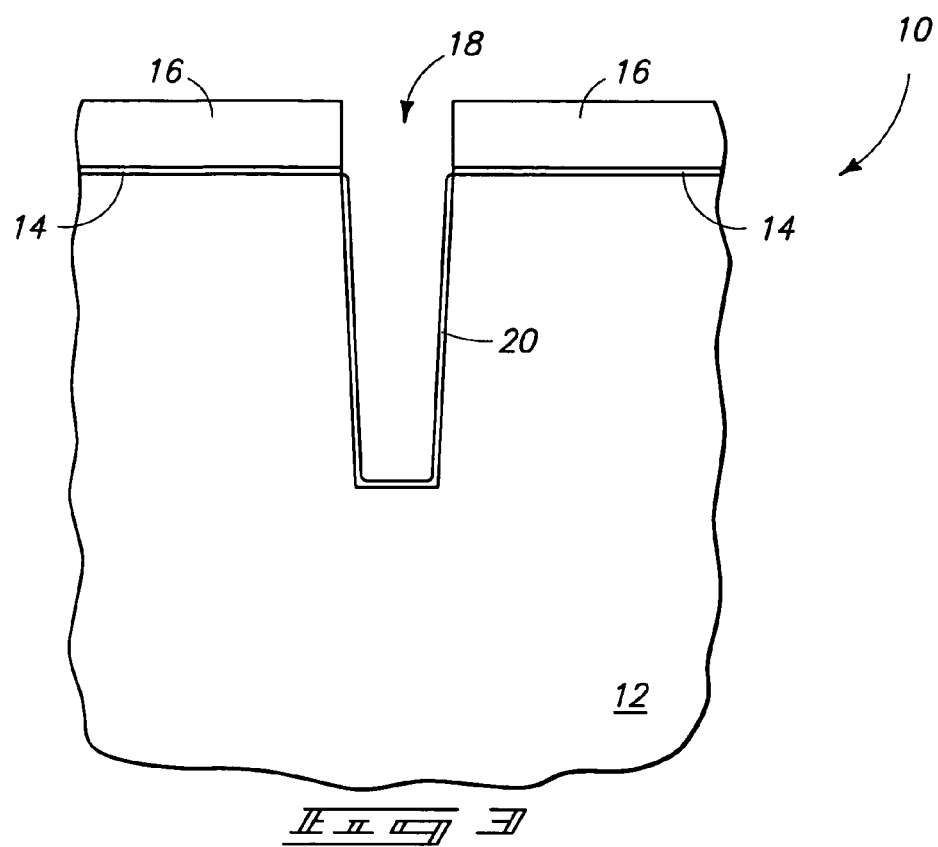
FIG. 3 is a view of the FIG. 1 wafer fragment shown at a processing stage subsequent to that of FIG. 2.

Referring next to FIG. 3, a liner 20 is formed along a periphery of opening 18. The shown liner extends only along semiconductor material substrate 12, and not along masking materials 14 and 16. However, it is to be understood that the invention also encompasses some aspects (not shown) in which the liner extends along exposed surfaces of layers 14 and 16, as well as along exposed surfaces of semiconductor material substrate 12.

Liner 20 can comprise any material suitable for protecting surfaces of substrate 12 during a subsequent etch (discussed below). For instance, liner 20 can comprise, consist essentially of, or consist of silicon dioxide. In such aspects, the liner can be formed by depositing silicon dioxide within the opening, and/or can be formed by thermal oxidation of exposed surfaces of a silicon-containing substrate 12 within the opening. If substrate 12 comprises semiconductor materials other than silicon, the oxide formed within the opening as liner 20 can be an oxide other than silicon dioxide. The oxidation utilized to form liner 20 can, for example, comprise oxidation with an $O_2$ plasma, either in situ or ex situ, and in some aspects chlorine can also be incorporated into the oxidation chemistry.

In some aspects of the invention, liner 20 can comprise, consist essentially of, or consist of a polymeric organic material (or, in other words, an organic polymer). For instance, the liner can comprise, consist essentially of, or consist of a combination of carbon, hydrogen and fluorine. In such aspects, the polymer can be formed from one or more of $CHF_3$, $CH_2F_2$, $CH_3F$, $CF_4$, $CH_4$, $C_2H_6$, $C_2H_4$, $NH_3$, and HBr. If the liner comprises an organic polymer, such can be directly on semiconductor material of substrate 12 (as shown), or can be over an intervening layer, such as, for example, a thin layer of native oxide.

The deposition conditions utilized for forming liner 20 can comprise moderate to high pressure, and low bias voltage to uniformly deposit the liner within opening 18. If the liner comprises a polymeric organic material, the liner can be deposited over exposed surfaces of layers 14 and 16 in addition to being deposited along exposed surfaces of semiconductor material substrate 12 within opening 18.

Figure 4:
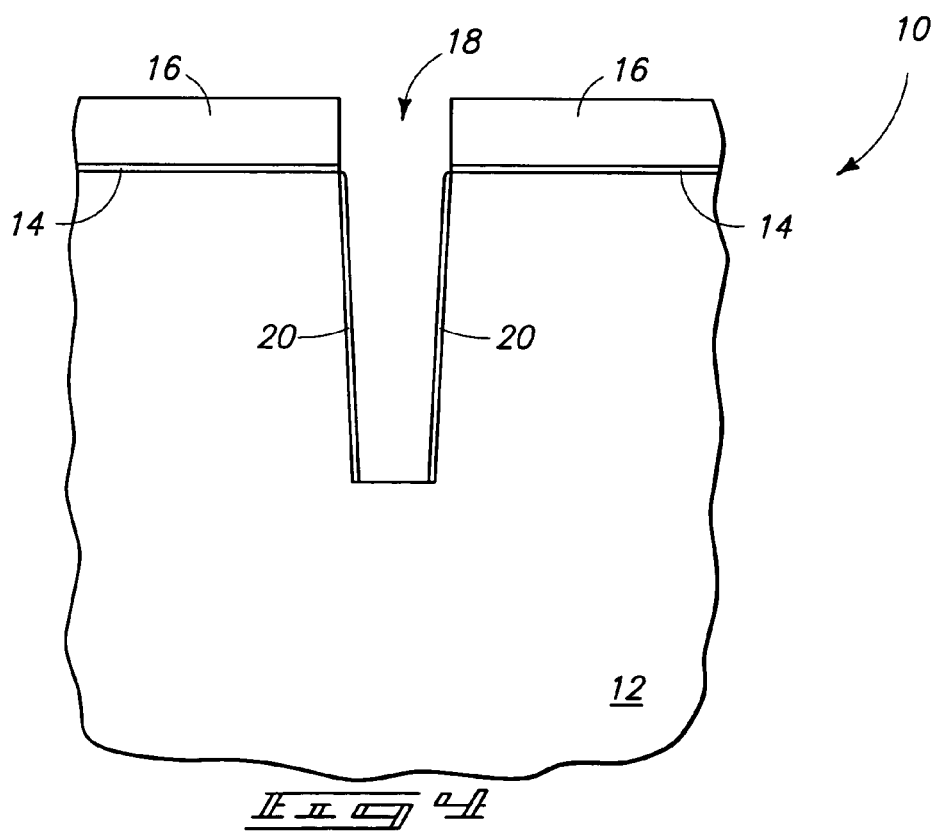
FIG. 4 is a view of the FIG. 1 wafer fragment shown at a processing stage subsequent to that of FIG. 3.

Referring next to FIG. 4, liner 20 is subjected to an anisotropic etch which removes the liner from along a lower region of opening 18 while leaving the liner along an upper region of the opening. The liner 20 appears to be broken into two separate segments in the shown cross-sectional view of FIG. 4. It is to be understood, however, that opening 18 can have a continuous sidewall if viewed from above, and that liner 20 can thus extend all the way around a lateral periphery of the sidewall at the processing stage of FIG. 4.

In some aspects, opening 18 can be considered to have an upper periphery and a lower periphery, with the lower periphery including, but not being limited to, a bottom-most portion of the opening. The shown etch has removed the liner from over the bottom-most portion of the opening, and not removed liner from regions above the bottom-most portion. The delineation between the upper periphery of the opening and the lower periphery of the opening can occur at any location within the opening, with the general understanding being that the liner remaining at the processing stage of FIG. 4 protects an entirety of the upper periphery of the opening, and that at least a portion of the lower periphery of the opening is unlined. The unlined portion of the lower periphery can be the bottom-most portion of the lower periphery, can be a region proximate the bottom-most portion of the lower periphery, or can be some combination of the bottom-most portion of the opening and a region proximate the bottom-most portion of the opening.

The etch chemistry utilized to remove liner 20 from the lower periphery of the opening can be any suitable etch chemistry. For instance, if liner 20 comprises, consists essentially of, or consists of silicon dioxide or an organic polymer, the etch can utilize one or more of $CF_4$, $CHF_3$, $CH_2F_2$, HBr, and $Cl_2$; and would typically be conducted at low pressure and with a moderate to high bias. The bias can cause the etch to be highly anisotropic.

The construction of FIG. 4 can be considered to contain an opening 18 extending into semiconductor material of substrate 12, with an upper periphery of the opening protected by the liner 20 and at least a portion of a lower periphery of the opening being unlined. Alternatively, the unlined portion of the opening can be considered to be an unlined lower region of the opening, and the lined portion of the opening can be considered to be a lined upper region of the opening.

Figure 5:
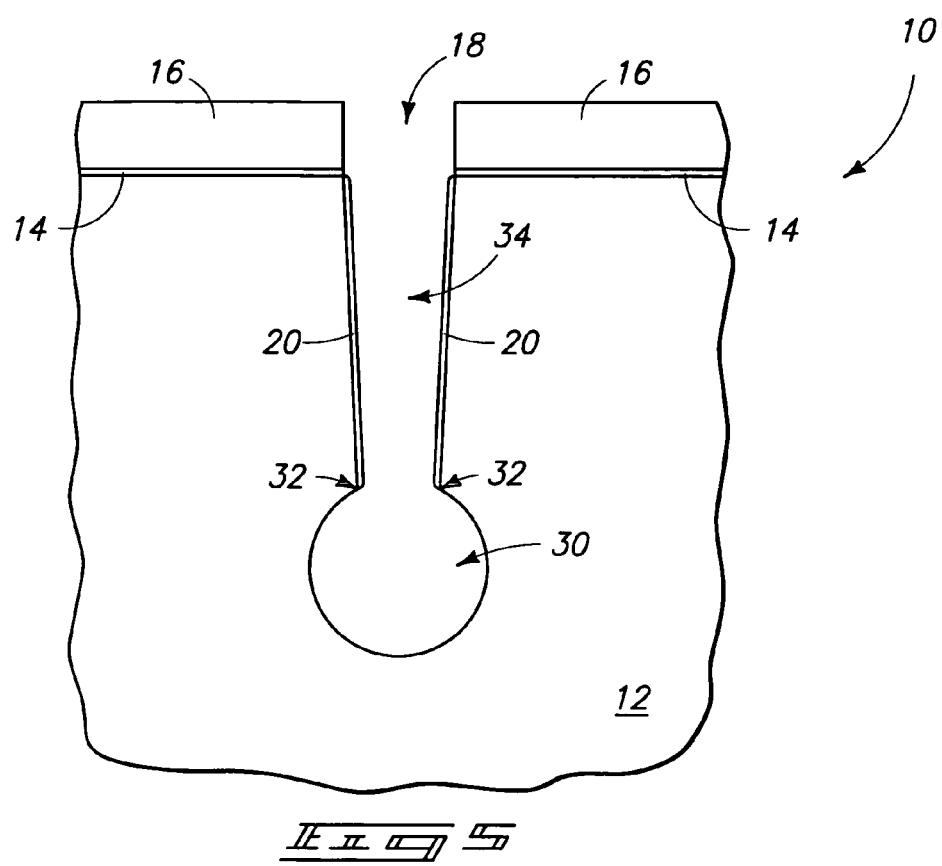
FIG. 5 is a view of the FIG. 1 wafer fragment shown at a processing stage subsequent to that of FIG. 4.

Referring next to FIG. 5, the liner 20 is utilized to protect sidewalls of opening 18 while the unlined portion of opening 18 is exposed to an etch. The etch is typically isotropic, substantially isotropic, or at least a transition etch between an anisotropic etch and an isotropic etch. The etch widens the lower portion of opening 18 to form a widened extension 30 of the opening. In the shown aspect of the invention, the widened extension 30 is a bulbous extension.

The etch utilized to form widened extension 30 can comprise any suitable etch chemistry, and in particular aspects will comprise substantially isotropic chemistry selective for semiconductor material of substrate 12 (such semiconductor material can be silicon, for example) relative to the silicon dioxide of layer 14, the silicon nitride of layer 16, and the material of liner 20. The etch chemistry can, for example, be based on $NF_3$ and/or $SF_6$, and can also include one or more of HBr, $CHF_3$, $CH_2F_2$ and $O_2$ as moderating agents (with such moderating agents being specifically included to suppress lateral etching so that the bowl 30 ends up being relatively circular in configuration rather than being overly-elongated in lateral directions). The etching can be accomplished utilizing either wet etch or dry etch processes.

Although the etching utilized to form the widened regions of the opening can be isotropic etching, it is to be understood that the etching would typically be substantially isotropic, rather than absolutely isotropic. In other words, the etch will typically have some minor anisotropic component either purposely or due to, for example, difficulties in creating an absolutely isotropic etch; but will be mostly isotropic. For purposes of interpreting this disclosure and the claims that follow, the phrase "at least substantially isotropic" is to be understood to comprise substantially isotropic conditions and absolutely isotropic conditions.

The cross-sectional configuration of FIG. 5 can be considered to comprise an opening 18 having a configuration of a narrow stem region 34 extending upwardly from a widened bottom region 30. The shown widened region 30 has relatively sharp corners 32 where the widened regions joins with the narrow region of the opening. The sharpness of the corners 32 can be modified by coupling an anisotropic first etch with an isotropic second etch during formation of widened region 30, as will be discussed in more detail with reference to FIGS. 12 and 13 below. It is to be understood that the opening 18 can be in the shape of a trench extending longitudinally into and out of the page relative to the shown cross-sectional view of FIG. 5.

Figure 6:
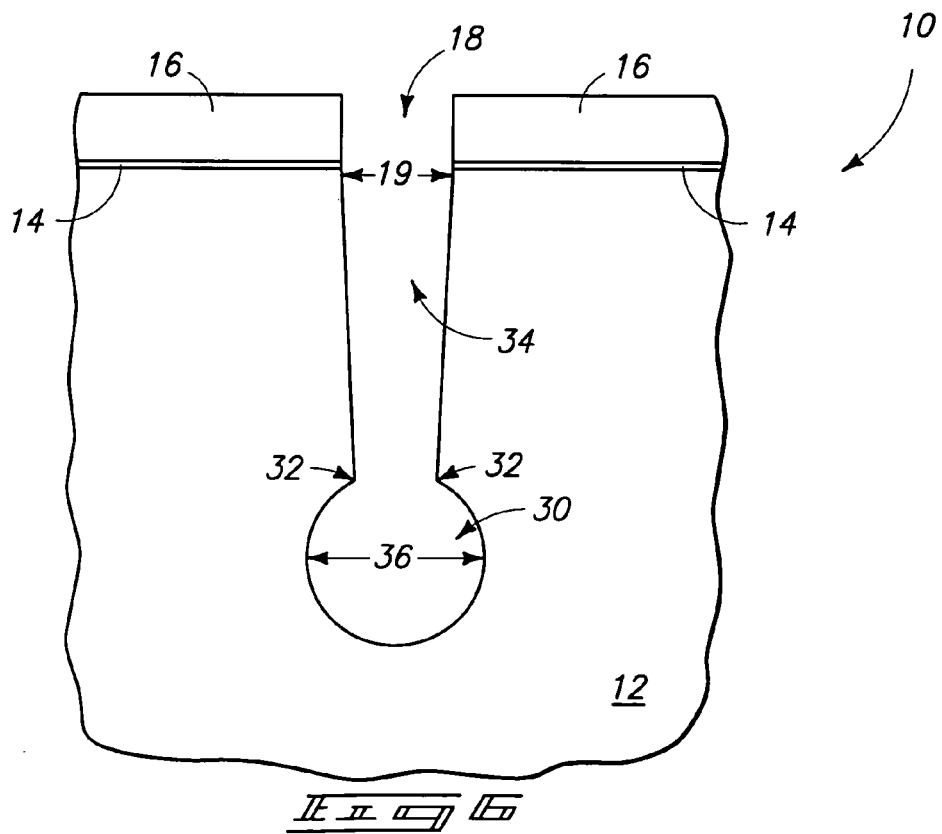
FIG. 6 is a view of the FIG. 1 wafer fragment shown at a processing stage subsequent to that of FIG. 5.

Referring to FIG. 6, liner 20 (FIG. 5) is removed from within the stem region 34 of opening 18. Such removal can be accomplished with any suitable etch chemistry.

The opening 18 of FIG. 6 can have any suitable dimensions. In some aspects, the stem region can have a maximum cross-sectional width 19 of less than about 100 nanometers, and in particular aspects will have a maximum cross-sectional width of from about 50 nanometers to about 100 nanometers. The widened region 30 can have a maximum cross-sectional width 36 that is at least 10 nanometers greater than the width 19, and in particular aspects can be from about 20 nanometers greater to about 80 nanometers greater than the width 19 in the shown cross-sectional view (in other words, can extend from about 10 nanometers to about 40 nanometers laterally outward on either side of the original most-laterally-outward sidewall edges of opening 18 in the shown cross-sectional view).

Figure 7:
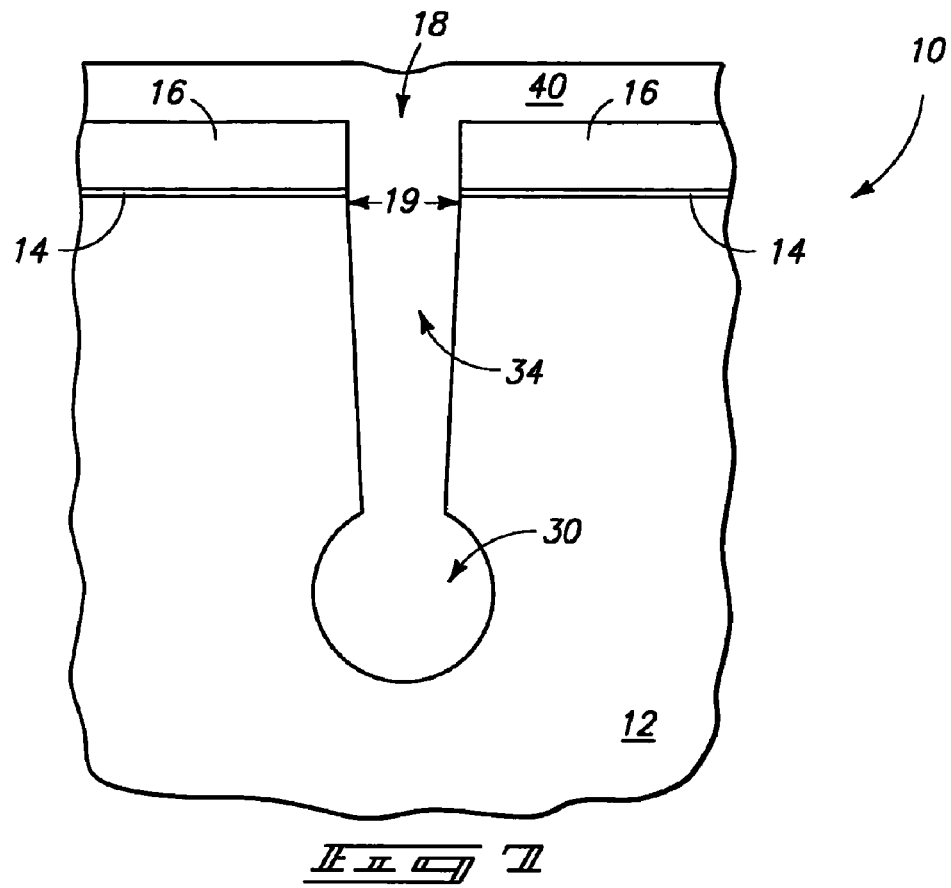
FIG. 7 is a view of the FIG. 1 wafer fragment shown at a processing stage subsequent to that of FIG. 6.

Referring to FIG. 7, opening 18 is filled with material 40. In particular aspects of the invention, opening 18 is ultimately utilized to form an electrical isolation region extending within substrate 12, and accordingly material 40 can correspond to an electrically insulative material. In such aspects, material 40 can comprise any suitable electrically insulative composition or combination of compositions, and can, for example, comprise, consist essentially of, or consist of silicon dioxide. Although the material 40 is shown filling an entirety of opening 18, it is to be understood that the invention encompasses other aspects (not shown) in which the material only fills a portion of opening 18. For instance, material 40 can substantially fill the bulbous extension 30 without entirely filling the rest of the opening, or can substantially fill the bulbous region 30 and also substantially fill the stem region 34 extending upwardly from the bulbous region.

Although the shown aspect of the invention has the liner removed from within the stem region, it is to be understood that the invention also encompasses aspects in which the liner remains within the stem region as opening 18 is filled with various materials. For instance, if the liner comprises silicon dioxide, and the stem region is ultimately going to be filled with silicon dioxide to form an isolation region, the silicon dioxide of the liner can remain within the stem region. However, it can be advantageous to clean the liner from within the stem region in order to remove contaminating materials that may have accumulated on the liner during the processing of forming the opening 30, regardless of whether or not the liner otherwise comprises a composition suitable for incorporation into materials that are going to be utilized to fill the opening.

Figure 8:
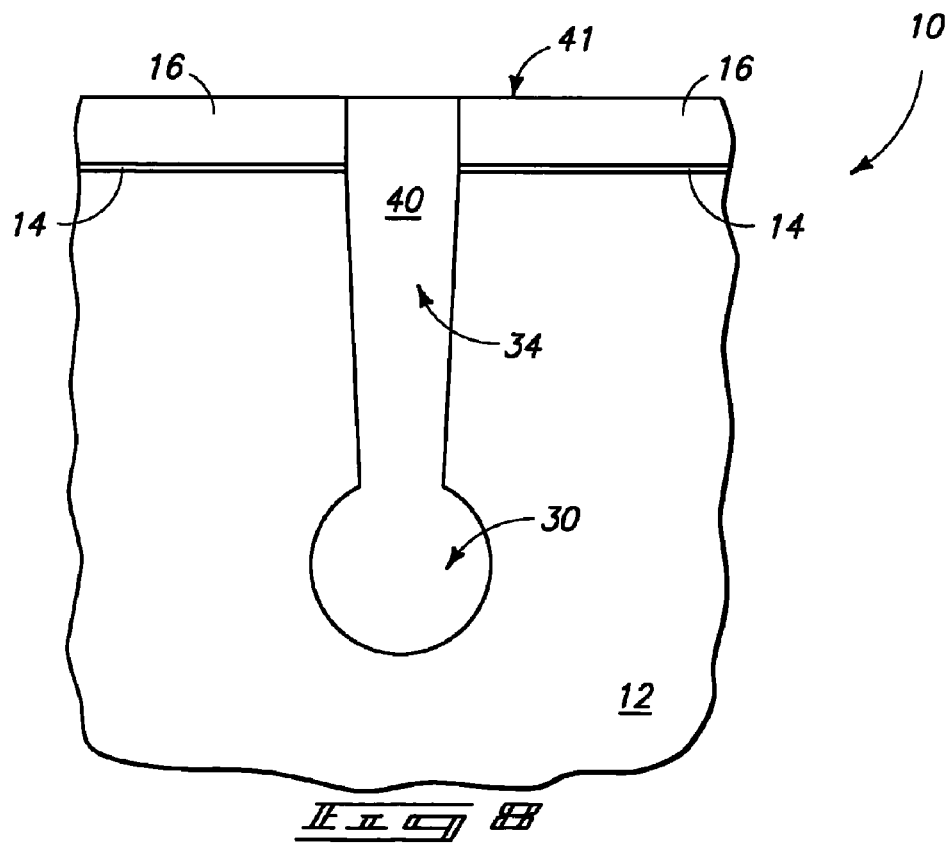
FIG. 8 is a view of the FIG. 1 wafer fragment shown at a processing stage subsequent to that of FIG. 7.

Referring next to FIG. 8, construction 10 is subjected to polishing (such as, for example, chemical-mechanical polishing) to form a planarized upper surface 41 extending across layer 16 and across an upper surface of insulative material 40. The planarization can stop at about an uppermost surface of layer 16, or in some aspects can extend into layer 16.

Referring to FIG. 9, layers 14 and 16 (FIG. 8) are removed. The structure comprising insulative material 40 can, in some aspects, be an isolation structure, and can be considered to correspond to a trenched isolation structure. Such isolation structure has, in the shown cross-sectional view, the widened base 30 (which can also be referred to as a bulbous region or bowl region) and the stem 34 extending upwardly from such base. Circuit devices can be provided on opposing sides of the isolation structure, and the structure can then be utilized to provide electrical separation between the devices.

FIG. 10 illustrates an exemplary construction utilizing the isolation structure of material 40 to provide electrical isolation between a first transistor device 50 and a second transistor device 60. The first transistor device is formed on one side of the isolation structure, and the second transistor device is formed on an opposing side of the isolation structure. The first transistor device comprises a transistor gate 52 comprising a gate dielectric material 54, a conductive gate material 56, and an insulative cap 58. The gate dielectric can, for example, comprise, consist essentially of, or consist of silicon dioxide. The conductive gate material can comprise any suitable electrically conductive composition or combination of compositions, and in particular aspects will comprise one or more of various metals, metal compositions, and conductively-doped semiconductor material (such as, for example, conductively-doped silicon). Electrically insulative cap 58 can comprise any suitable electrically insulative composition or combination of compositions, and in particular aspects will comprise one or both of silicon nitride and silicon dioxide.

A pair of source/drain regions 57 are proximate gate 52, and are electrically coupled to one another through a channel region beneath gate 52 and controlled by gate 52. Source/drain regions 57 comprise conductively-doped diffusion regions extending into substrate 12, and can comprise one or both of p-type dopant and n-type dopant. The shown source/drain regions 57 comprise lightly-doped extensions 59 and heavily-doped regions 55, as will be recognized by persons of ordinary skill in the art.

Transistor device 50 is shown to comprise sidewall spacers 53 beside the gate 52. Such sidewall spacers can comprise any suitable composition or combination of compositions, and in particular aspects will comprise, consist essentially of, or consist of one or both of silicon nitride and silicon dioxide.

Transistor device 60 comprises a gate 62 containing gate dielectric 64, conductive gate material 66, and an insulative cap 68. The gate dielectric 64, conductive gate material 66 and insulative cap 68 can comprise the same compositions as discussed above for gate dielectric 54, conductive gate material 56, and insulative cap 58. Transistor device 60 also comprises source/drain diffusion regions 67 extending into substrate 12, and having lightly-doped extensions 69 and heavily-doped regions 65. In some aspects, source/drain regions 57 can be referred to as first source/drain regions, and source/drain region 67 can be referred to as second source/drain regions.

The second transistor device 60 comprises sidewall spacers 63 which are analogous to the sidewall spacers 53, and which can comprise the same compositions discussed previously for sidewall spacers 53.

Figure 11:
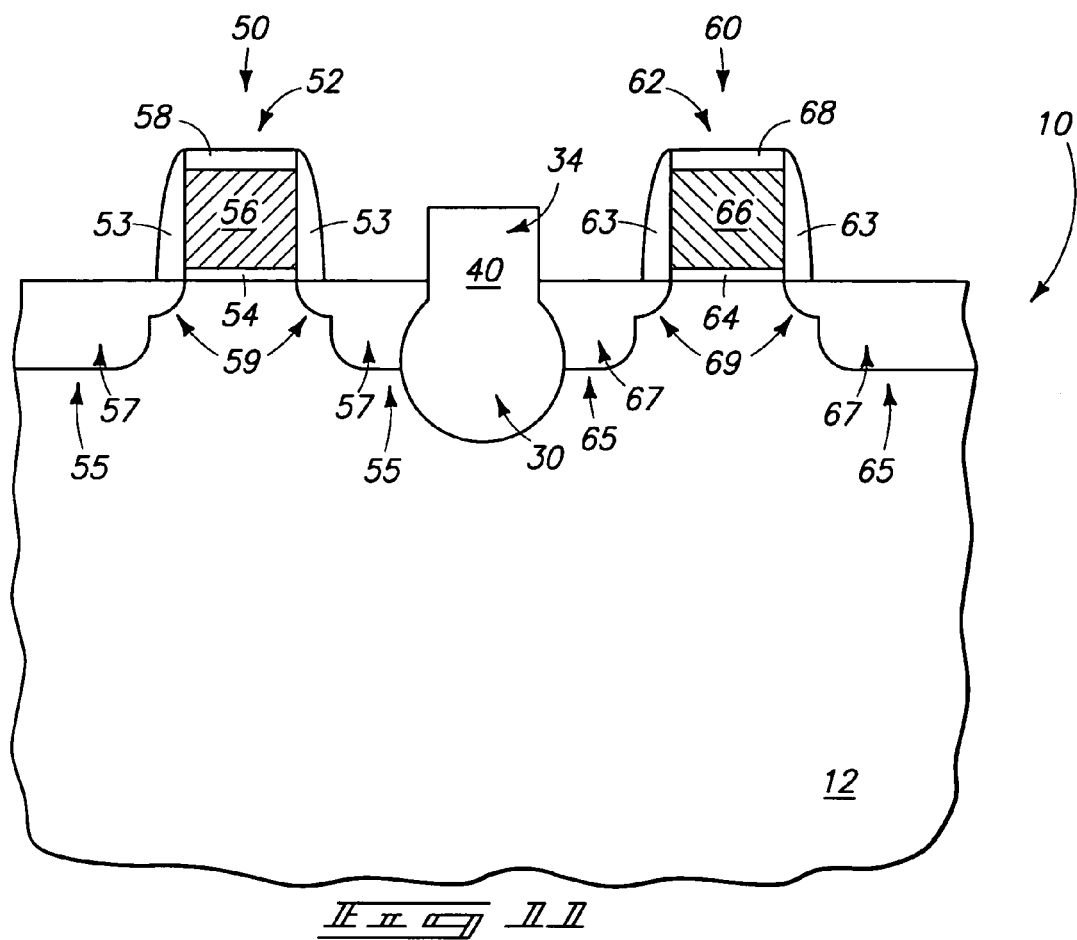
FIG. 11 is a view of the FIG. 1 wafer fragment shown at a processing stage subsequent to that of FIG. 9 in accordance with an aspect alternative to that of FIG. 10.

The cross-sectional view of the construction of FIG. 10 has the source/drain regions 57 and 67 entirely above bulbous region 30, and spaced from bulbous region 30 by gaps 70 between the source/drain regions and the bulbous region. In some aspects of the invention, it can be advantageous to form isolation structure 40 with the bulbous region more shallow than that of FIG. 10 so that source/drain regions of adjacent transistor devices extend to the bulbous region. For instance, FIG. 11 shows a structure similar to FIG. 10, but with the source/drain regions of transistor devices 50 and 60 extending to bulbous region 30 of the isolation structure. The structures of FIG. 11 are labeled identically to the structures of FIG. 10.

It can be advantageous to form the source/drain regions of adjacent transistor devices to extend down to the bulbous region 30 of isolation structure 40 to remove a source of junction leakage. Alternatively, it can be advantageous to form structures of the type shown in FIG. 10 where the source/drain regions are well above the bulbous region 30 of isolation structure 40 so that the bulbous region does not impact performance of adjacent transistor devices other than providing better electrical isolation between the devices than can be achieved with prior art isolation regions.

Although the isolation regions of FIGS. 10 and 11 have the stem 34 extending upwardly above an uppermost surface of substrate 12, it is to be understood that the invention encompasses other aspects (not shown) in which the stem is further polished after removal of layers 14 and 16 (FIG. 8) so that the stem has an uppermost surface which is approximately coplanar with an uppermost surface of substrate 12.

The aspect of the invention discussed above with reference to FIG. 5 pertained to an embodiment of the invention in which an isotropic etch was conducted immediately after removing the liner from along a bottom portion of the opening 18 of FIG. 4. Another aspect of the invention comprises a first anisotropic etch through the unlined portion of the opening followed by the isotropic etch. Utilization of the first anisotropic etch can enable the corners adjacent the bulbous region (such as, for example, the corners 32 shown in FIG. 5) to have controlled sharpness. The aspect of utilizing the anisotropic etch/isotropic etch combination to control corner sharpness is described with reference to FIGS. 12 and 13.

Figure 12:
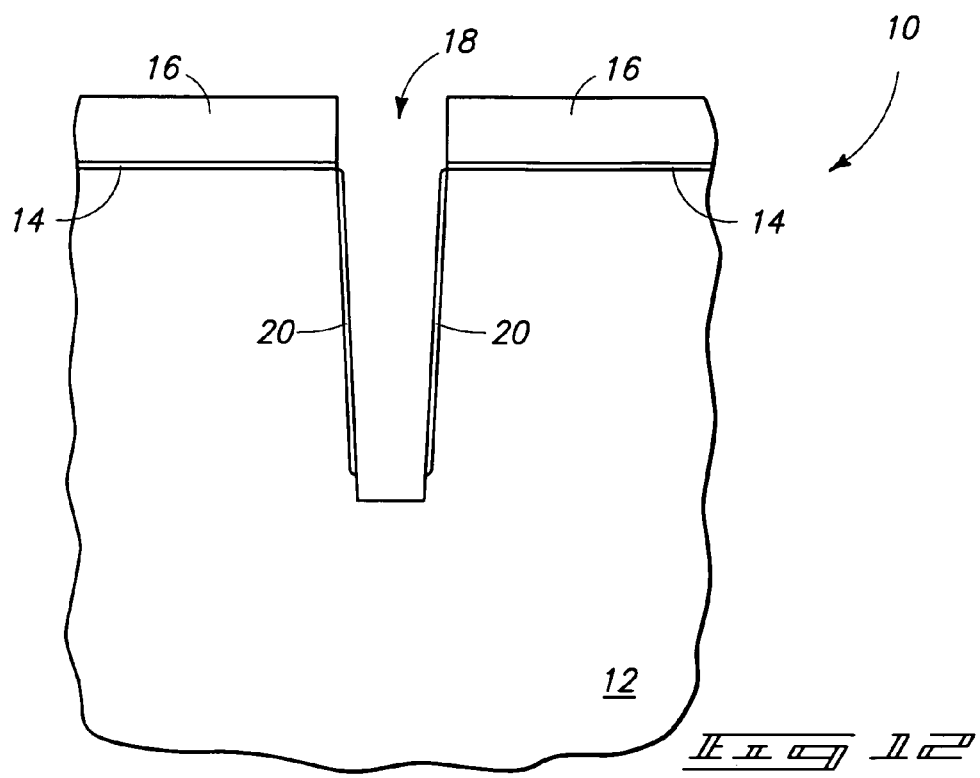
FIG. 12 is a view of the FIG. 1 wafer fragment shown at a processing stage subsequent to that of FIG. 4 in accordance with an aspect of the invention alternative to that of FIG. 5.

Referring initially to FIG. 12, construction 10 is shown at a processing stage subsequent to that of FIG. 4. Identical numbering is utilized in describing FIG. 12 as was used above in describing the embodiment of FIG. 4. Thus, the construction 10 is shown to comprise the layers 16 and 14 over substrate 12, and is shown to have the opening 18 extending into substrate 12. The processing stage of FIG. 12 has opening 18 extended to a greater depth than the opening is at the processing stage of FIG. 4 due to utilization of an anisotropic etch to extend the opening through the unlined portion of FIG. 4.

Figure 13:
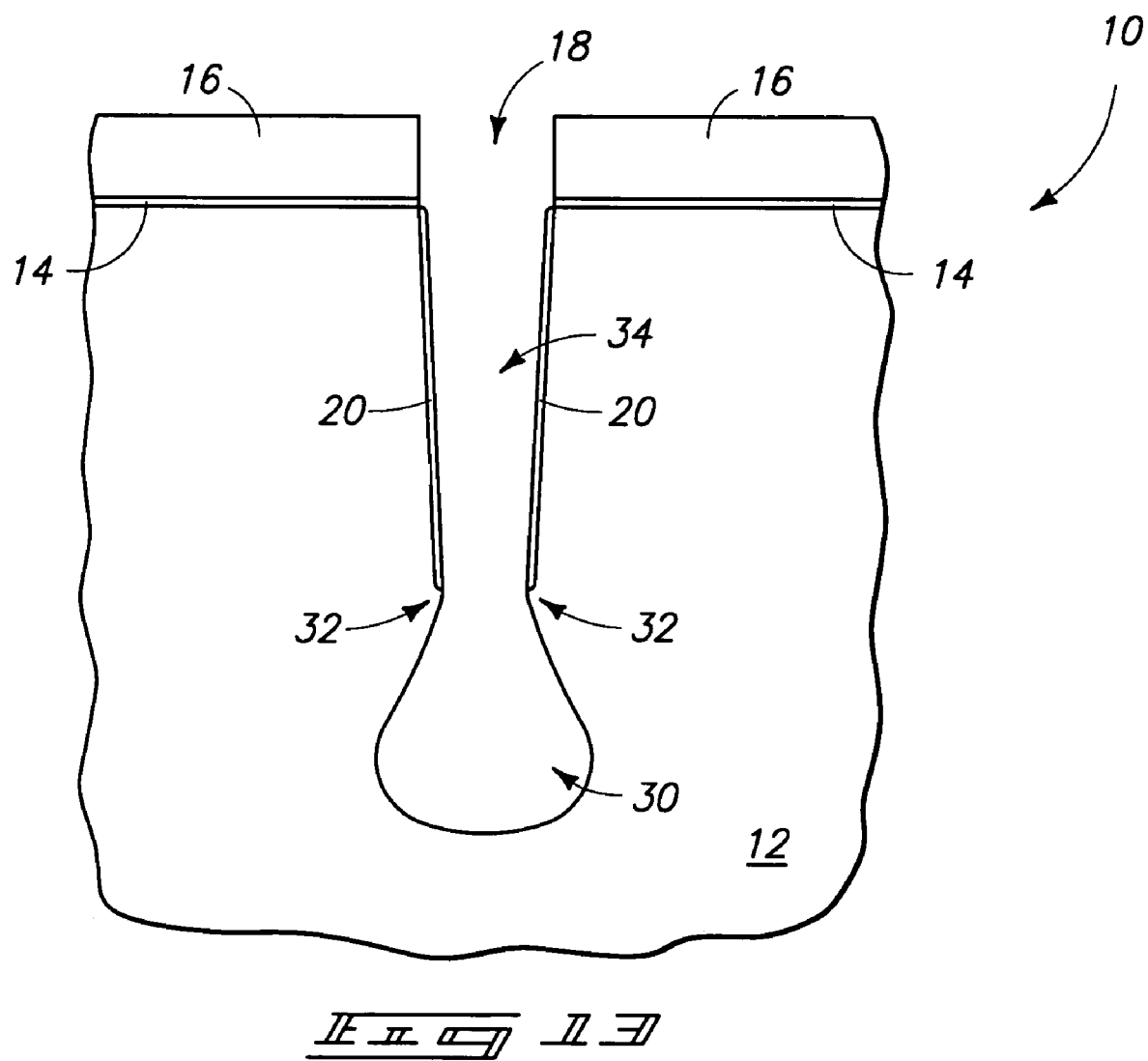
FIG. 13 is a view of the FIG. 1 wafer fragment shown at a processing stage subsequent to that of FIG. 12.

Referring to FIG. 13, an isotropic etch is subsequently utilized to form the bowl region 30 of opening 18. The aspect of FIG. 13 has smoother corners 32 where the bowl region meets the stem region 34 than did the aspect of FIG. 5. In some applications of the invention, $NF_3$ and HBr are utilized for the isotropic etching of FIG. 13 as well as for the anisotropic etching of FIG. 12, and the amount of downward direction of the etch relative to sideward direction of the etch is controlled by the ratio of $NF_3$ to HBr. An isotropic etch will typically etch about 70% downward relative to the amount that it etches laterally, and an etch which does greater than 70% downward relative to the amount that it etches laterally is typically considered to be an anisotropic etch.

The smoothness of the transition between the bulbous region 30 and the stem region 34 of opening 18 of FIG. 13 can improve characteristics of an isolation structure formed within the opening relative to the embodiment of FIG. 5. In some aspects, the transition between the stem region and widened region 30 can be smoothed by thermal oxidation utilized during formation of insulative material within opening 18 in addition to, or alternatively to, utilization of the anisotropic etch through the unlined portion prior to the isotropic etch.

The various aspects to the invention discussed above with reference to FIGS. 1-13 can be utilized for numerous applications. In some applications, the invention can be utilized for forming new trenched isolation structures (for example, shallow trenched isolation structures) for improving cell-to-cell isolation in memory arrays (for example, dynamic random access memory arrays). The invention incorporates a relatively minor change in standard trench isolation processes, and accordingly can be economically incorporated into conventional processes. By adjusting the isolation region depth, and by adjusting the size of the bowl formed at the bottom of the isolation region, cell side junction leakage can be reduced by shutting down part of a junction leakage path, which can help data retention. The structures of the present invention can be applicable for current and future DRAM generations, and can be incorporated into processing without adding new masks or complicated new processing levels.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method, comprising:
providing a semiconductor material;
forming a trench extending into the semiconductor material, the trench having a maximum cross-sectional width extending transversely across the trench at the widest portion of the trench of less than or equal to about 100 nanometers and the trench having a length extending orthogonally to the width;
forming liner material containing an oxide over an entirety of both a lower periphery and an upper periphery of the trench by oxidation of the semiconductor material;
anisotropically etching the liner material to remove the liner material from at least a portion of the lower periphery while leaving the liner material along the upper periphery of the trench as a liner protecting the upper periphery of the trench, the unlined portion of the trench including an entirety of a bottom of the trench;
while protecting the upper periphery, etching through the unlined portion to form a bulbous extension of the trench; the etching utilizing an etch that is anisotropic, followed by an etch that is at least substantially isotropic; the isotropic etch using $NF_3$ and further using a HBr moderating agent that suppresses lateral etching; the bulbous extension being relatively circular along at least one cross-section, including smooth corners where the bulbous extension transitions with the trench, and having a maximum cross-sectional width that is at least 10 nanometers greater than the maximum width of the trench; controlling a ratio of $NF_3$ to HBr for the isotropic etching to control smoothness of the corners and to etch less than or equal to about 70% downward relative to the amount of etching laterally;
after forming the bulbous extension, removing the liner from the trench;
after removing the liner, substantially filling the trench with insulative material to form an isolation region extending into the semiconductor material, the isolation region comprising a bulbous bottom portion where the insulative material extends into the bulbous extension; and
forming a pair of transistors to be supported by the semiconductor material; each of the individual transistors comprising a gate over the semiconductor material and comprising source/drain regions extending into the semiconductor material; one of the transistors being a first transistor comprising a first gate and first source/drain regions, and the other of the transistors being a second transistor comprising a second gate and second source/drain regions; one of the first source/drain regions being in contact with one side of the isolation region, and one of the second source/drain regions being in contact with a side opposing said one side of the isolation region; the isolation region thus electrically isolating the first and second transistors from one another; neither of the first transistor gate and the second transistor gate having any region directly over any portion of the bulbous bottom portion of the isolation region.

2. The method of claim 1 wherein the semiconductor material comprises silicon.

3. A semiconductor processing method, comprising:
providing a semiconductor material;
forming a trench extending into the semiconductor material to a first depth, the trench having a maximum cross-sectional width extending transversely across the trench at the widest portion of the trench of less than or equal to about 100 nanometers and the trench having a length extending orthogonally to the width;
lining a periphery of the trench with a liner comprising an organic polymer containing carbon, hydrogen and fluorine;
anisotropically etching the liner from a lower region of the trench while leaving the liner along an upper region of the trench;
etching through the unlined lower region of the trench with an etch that is anisotropic to extend the trench into the semiconductor material to a second depth;
after extending the trench to the second depth, etching through the unlined lower region of the trench with an etch that is at least substantially isotropic to form a widened extension of the trench and to extend the trench to a third depth; the isotropic etch using $NF_3$ and further using a HBr moderating agent that suppresses lateral etching; the widened extension including smooth corners where the widened extension transitions with the trench and having a maximum cross-sectional width that is at least 10 nanometers greater than the maximum width of the trench; controlling a ratio of $NF_3$ to HBr for the isotropic etching to control smoothness of the corners and to etch less than or equal to about 70% downward relative to the amount of etching laterally;
after forming the widened extension of the trench, removing the liner from the trench;
after removing the liner, substantially filling the trench with insulative material to form an isolation region extending into the semiconductor material, the isolation region comprising a bulbous bottom portion where the insulative material extends into the widened extension; the bulbous bottom portion being relatively circular along at least one cross-section;
forming a pair of transistors to be supported by the semiconductor material; each of the individual transistors comprising a gate over the semiconductor material and comprising source/drain regions extending into the semiconductor material; one of the transistors being a first transistor comprising a first gate and being on a first side of the isolation region, and the other of the transistors being a second transistor comprising a second gate and being on a side opposing said first side of the isolation region; each of the first and second transistors having a source/drain region that contacts the isolation region; the isolation region electrically isolating the first and second transistors from one another;
the first transistor gate not having any portion directly over the bulbous bottom portion of the isolation region; and
the second transistor gate not having any portion directly over the bulbous bottom portion of the isolation region.

4. The method of claim 3 wherein the semiconductor material consists essentially of silicon.

5. The method of claim 1 wherein the maximum width of the opening is from about 50 to about 100 nanometers and the maximum width of the bulbous extension is from about 20 to about 80 nanometers greater than the maximum width of the opening.

6. The method of claim 3 wherein the maximum width of the opening is from about 50 to about 100 nanometers and the maximum width of the bulbous extension is from about 20 to about 80 nanometers greater than the maximum width of the opening.

7. A semiconductor processing method, comprising:
providing a semiconductor material;

forming an opening extending into the semiconductor material, the opening having a maximum cross-sectional width extending transversely across the opening at the widest portion of the opening of less than or equal to about 100 nanometers;

protecting an upper periphery of the opening with a liner while leaving at least a portion of a lower periphery of the opening unlined;

while protecting the upper periphery, etching through the unlined portion to form a bulbous extension of the opening; the etching utilizing an etch that is anisotropic, followed by an etch that is at least substantially isotropic; the isotropic etch using an etching agent and a moderating agent that suppresses lateral etching; the bulbous extension having a maximum cross-sectional width that is at least 10 nanometers greater than the maximum width of the opening and including smooth corners where the bulbous extension transitions with the opening; controlling a ratio of the etching agent to the moderating agent for the isotropic etching to control smoothness of the corners and to etch less than or equal to about 70% downward relative to the amount of etching laterally;

after forming the bulbous extension, substantially filling the opening with insulative material to form an isolation region extending into the semiconductor material, the isolation region comprising a bulbous bottom portion where the insulative material extends into the bulbous extension.

8. The method of claim 7 wherein the semiconductor material comprises silicon.

9. The method of claim 7 wherein the maximum width of the opening is from about 50 to about 100 nanometers and the maximum width of the bulbous extension is from about 20 to about 80 nanometers greater than the maximum width of the opening.

10. The method of claim 7 wherein the at least substantially isotropic etch uses $NF_3$ and/or $SF_6$ and further uses the moderating agent selected from the group consisting of HBr, $CHF_3$, $CH_2F_2$, $O_2$, and combinations thereof.

11. The method of claim 7 wherein the opening comprises a trench having a length extending orthogonally to the width.

12. The method of claim 1 wherein the ratio of $NF_3$ to HBr produces smooth corners exhibiting an obtuse angle.

13. The method of claim 3 wherein the ratio of $NF_3$ to HBr produces smooth corners exhibiting an obtuse angle.

14. The method of claim 7 wherein the ratio of the etching agent to the moderating agent produces smooth corners exhibiting an obtuse angle.

* * * * *